(12) United States Patent
Vetter et al.

(10) Patent No.: US 8,956,722 B2
(45) Date of Patent: Feb. 17, 2015

(54) LAYER SYSTEM FOR THE FORMATION OF A SURFACE LAYER ON A SURFACE OF A SUBSTRATE AND COATING METHOD FOR THE MANUFACTURE OF A LAYER SYSTEM

(75) Inventors: Joerg Vetter, Bergisch Gladbach (DE); Georg Erkens, Aachen (DE)

(73) Assignee: Oerlikon Metaplas GmbH, Bergisch-Gladbach (DE)

( * ) Notice: Subject to any disclaimer, the term of this patent is extended or adjusted under 35 U.S.C. 154(b) by 263 days.

(21) Appl. No.: 13/203,325

(22) PCT Filed: Jul. 2, 2009

(86) PCT No.: PCT/EP2009/058322
§ 371 (c)(1),
(2), (4) Date: Oct. 27, 2011

(87) PCT Pub. No.: WO2010/097124
PCT Pub. Date: Sep. 2, 2010

(65) Prior Publication Data

US 2012/0189841 A1    Jul. 26, 2012

(30) Foreign Application Priority Data

Feb. 27, 2009    (EP) .................................... 09153956

(51) Int. Cl.
C23C 14/06    (2006.01)
C22C 14/00    (2006.01)
(Continued)

(52) U.S. Cl.
CPC ............. *C23C 14/0641* (2013.01); *C22C 14/00* (2013.01); *C22C 27/025* (2013.01); *C22C 27/06* (2013.01); *C23C 28/044* (2013.01); *C23C 28/048* (2013.01)
USPC ............... 428/336; 51/307; 51/309; 428/469; 428/472; 428/697; 428/698; 428/699; 428/701; 428/702

(58) Field of Classification Search
USPC ............ 51/307, 309; 428/336, 469, 472, 697, 428/698, 699, 701, 702
See application file for complete search history.

(56) References Cited

U.S. PATENT DOCUMENTS 6,623,850 B2    9/2003 Kukino et al.
7,159,640 B2 *  1/2007 Inoue et al. .................. 164/312
(Continued)

FOREIGN PATENT DOCUMENTS

EP    0093706 A1    11/1983
EP    1783245 A1    5/2007
(Continued)

OTHER PUBLICATIONS

PCT Search Report for PCT/EP2009/058322 Mar. 29, 2010.

*Primary Examiner* — Archene Turner
(74) *Attorney, Agent, or Firm* — Robert S. Green

(57) ABSTRACT

The invention thus relates to a layer system (1) for the formation of a surface layer on a surface of a substrate, in particular on the surface of a tool, in particular on the surface of a shaping tool, wherein the layer system includes at least a first surface layer of the composition $(V_a Me_b M_c X_d)_\alpha (N_u C_v O_w)_\beta$, where $(a+b+c+d)=\alpha$, $\alpha=100\%$, with respect to the atoms $V_a, Me_b, M_c, X_d$ present in the layer, $(u+v+w)=\beta$. $\beta=100$ with respect to the atoms N, C, O present in the layer, with the sum of all the atoms in the layer $(\alpha+\beta)=100$ at %, where $40 \leq \alpha \leq 80$ at % applies, and where $Me_b$ is at least one element from the group of chemical elements including Zr, Hf, Nb, Ta, Mo, W, Ni, Cu, Sc, Y, La, Ce, Pr, Nd, Pm, Sm of the periodic system of chemical elements and $M_c$ is at least one element of the group of chemical elements including Ti, Cr, and $X_d$ is at least one element from the group of chemical elements including S, Se, Si, B of the periodic system of elements, where $0 \leq u \leq 100$, $0 \leq v \leq 100$ and $0 \leq w \leq 80$. In accordance with the invention $50 \leq a \leq 99$, $1 \leq b \leq 50$, $0 \leq c \leq 50$ and $0 \leq d \leq 20$.

25 Claims, 5 Drawing Sheets

(51) Int. Cl.
  *C22C 27/02* (2006.01)
  *C22C 27/06* (2006.01)
  *C23C 28/04* (2006.01)

(56) References Cited

U.S. PATENT DOCUMENTS

| | | | |
|---|---|---|---|
| 7,241,492 B2 | 7/2007 | Kohara et al. | |
| 7,618,719 B2 * | 11/2009 | Ito et al. | 428/697 |
| 7,935,426 B2 | 5/2011 | Vetter | |
| 7,967,275 B2 * | 6/2011 | Yamamoto | 428/697 |
| 8,017,226 B2 * | 9/2011 | Yamamoto | 428/336 |
| 8,043,728 B2 * | 10/2011 | Yamamoto | 428/699 |
| 8,173,248 B2 * | 5/2012 | Hovsepian et al. | 51/307 |
| 8,206,812 B2 * | 6/2012 | Selinder et al. | 428/336 |
| 8,216,700 B2 * | 7/2012 | Yamamoto | 428/699 |
| 8,465,852 B2 | 6/2013 | Yamamoto | |
| 8,470,456 B2 * | 6/2013 | Vetter et al. | 428/697 |
| 2007/0178330 A1 * | 8/2007 | Sjolen et al. | 428/472 |
| 2008/0152882 A1 | 6/2008 | Selinder et al. | |
| 2008/0166580 A1 | 7/2008 | Selinder et al. | |
| 2009/0130465 A1 | 5/2009 | Vetter et al. | |

FOREIGN PATENT DOCUMENTS

| | | | |
|---|---|---|---|
| EP | 1932947 A2 | | 6/2008 |
| EP | 2022870 A2 | | 2/2009 |
| JP | 2000-144376 | * | 5/2000 |
| JP | 2002144110 A | | 5/2002 |
| JP | 2002-256967 | * | 9/2002 |
| JP | 2005089806 A | | 4/2005 |
| JP | 2006082290 A | | 3/2006 |
| JP | 2009035784 A | | 2/2009 |

* cited by examiner

| (V97at%Zr3at%)αNβ | 1 |
| V97at%Zr3at% | 4 |

LAYER SYSTEM FOR THE FORMATION OF A SURFACE LAYER ON A SURFACE OF A SUBSTRATE AND COATING METHOD FOR THE MANUFACTURE OF A LAYER SYSTEM

CROSS-REFERENCE TO RELATED APPLICATIONS

The present application claims priority under 35 U.S.C. §119 of European Patent Application No. 09153956.9 filed on Feb. 27, 2009, and is a 371 nationalization of PCT/EP2009/058322, the disclosures of which is expressly incorporated by reference herein in their entirety.

The invention relates to a layer system for the formation of a surface on a substrate. In particular on a surface of a tool, specifically of a tool for shaping, and to a method for the manufacture of a layer system in accordance with the preamble of the independent claim of the respective category.

The manufacture of efficient tools and components is usually realized by a coating of their surfaces. An important class of such coated substrates includes tools, among others in particular tools for shaping, but also cutting tools and components, above all wear parts for machines in all possible embodiments. Typical substrate materials which are coated are, among others, tool steels and hard metals, but also all possible other substrate materials.

A known problem in the coating of these materials in this respect is that both already have a high oxidation rate at air around 500° C. and already soften at relatively low temperatures (approx. 550° for HSS, 650° C. for hard metal). However, there is also the irritating factor on shaping that, in addition to abrasion wear, smearing of the material to be processed also has a troublesome effect. For this reason, the tool surfaces are provided with suitable protective layers which can considerably reduce both the abrasion procedures and the smearing.

The hard material layers known from the prior art are in this respect frequently based on conventional compounds such as TiN, TiNC, CrN, deposited by means of PVD processes or CVD processes. Such layers can only be used with limitations for tools subject to high loads. These known hard layers therefore have their limits with respect to their area of use due to their specific physical properties, above all with respect to their temperature load capacity. On the one hand, the hardness falls noticeably at increased temperatures; on the other hand, oxidation already starts at relatively low temperatures, which can result in increased layer wear at the working temperature.

Essentially two layer classes have been developed to deal with this problem which have an oxidation resistance in the range of up to 1000° C. and also have improved properties with respect to hardness.

The one layer class relates to base layers containing Al such as AlTiN and AlCrN, with additional elements being able to be added as alloys depending on the requirement. Typical compounds from this range are compounds of the type AlTiXNCO, where X is e.g. Cr or another metal. Layers of this type show an increase in performance with respect to abrasive wear both in cutting processes and in shaping. This can be deduced from the positive change of both the increase in hardness at the working temperature and of the increase in the oxidation resistance.

Another path taken in the prior art to increase the performance of coated tools (primarily of cutting tools) consists of the combination of conventional hard material layers as a carrier layer combined with finish layers as a functional layer. The layers containing Si (approx. 1-20 at %; at % stands for "atom percent" within the framework of this application) of the type MeSiXNCO (X=further metal or B) such as TiSiN must in particular be named as finish layers here which enable a further much improved temperature load. These layers are usually used in the dry cutting of hardened steels. Performance potential is certainly also to be expected in these layers.

The hard layer systems named in the following section are systems which are applied especially for cutting tools.

It is furthermore known, for example, to cut off oxidic ceramic layers such as $Al_2O_3$ by means of CVD processes on cutting inserts in order to be able to combat the wear processes at increased temperatures, in particular on turning.

Furthermore boron based layers such as $B_4C$ or also cubic BN layers are in the research stage. However, cubic BN has the decisive disadvantage that it is extremely complicated to produce. This is above all due to difficulties in the layer growth itself, but also due to the high internal stresses in the layers.

Despite all previous attempts, however, it has only been partly possible to provide PVD or CVD coatings which satisfy the ever higher demands on the mechanical properties such as on hardness, internal compressive stresses and durability, tribological properties such as adhesion tendency at higher temperatures as well as friction, oxidation resistance, phase stability and other characteristic properties, above all also at high surface pressures which occur in shaping.

A known solution of successfully treating shaping tools subject to high loads is the TD process (Toyota diffusion process). The saline bath process is in this respect carried out in the temperature range from approx. 870° C. up to approx. 1030° C. for the production of a diffusion layer on the basis of VC. This process therefore takes place at a treatment temperature which is above the typical tempering temperature of tool steels (usually between 500 and 550° C.). The known disadvantages of the saline bath processes, such as the required rinsing process after the treatment, should not be looked at in any more detail.

It is furthermore known to deposit VCN layers by means of PVD processes. Patent application JP20005046975 A describes a layer for tools which is made of an underlayer made of VNC which is applied directly to a cutting tool. A further wear protection layer is subsequently deposited.

The oxidation behavior of VN and TiN is examined in Surface Science 601 (2007) 1153-1159, A. Glaser et. al Oxidation of vanadium nitride and titanium nitride coatings; it is found here that VN already forms a closed homogeneous oxide layer at relatively low temperatures.

According to tribological experience, the oxide layer is able to inhibit or at least to reduce adhesion processes (smearing) between the workpiece material (e.g. sheet metal plate) and the coated tool.

It is therefore the object of the invention to provide an improved coating for a substrate, in particular for a tool, in particular for a shaping tool, or for a wear part, which overcomes the problems known from the prior art and in particular has an oxidation behavior which has a positive tribological effect and phase stability, improved mechanical properties, above all, but not only, with respect to hardness and internal compressive stresses, and which can be deposited at temperatures which do not exceed the tempering temperature of the steels used.

It is a further object of the invention to provide a method for the manufacture of such an improved coating.

The subject matters of the invention satisfying these objects are characterized by the features of the respective independent claims.

The dependent claims relate to particularly advantageous embodiments of the invention.

The invention thus relates to a layer system for the formation of a surface layer on a surface of a substrate, in particular on the surface of a tool, in particular on the surface of a shaping tool, wherein the layer system includes at least a first surface layer of the composition $(V_a Me_b M_c X_d)_\alpha (N_u C_v O_w)_\beta$, where $(a+b+c+d)=\alpha$, $\alpha=100\%$, with respect to the atoms $V_a, Me_b, M_c, X_d$ present in the layer, $(u+v+w)=\beta$, $\beta=100\%$ with respect to the atoms N, C, O present in the layer, with the sum of all the atoms in the layer $(\alpha+\beta)=100$ at %, where $40 \leq \alpha \leq 80$ at % applies, and where $Me_b$ is at least one element from the group of chemical elements including Zr, Hf, Nb, Ta, Mo, W, Ni, Cu, Sc, Y, La, Ce, Pr, Nd, Pm, Sm of the periodic system of chemical elements and $M_c$ is at least one element from the group of chemical elements including Ti, Cr, and $X_d$ is at least one element from the group of chemical elements including S, Se, Si, B of the periodic system of elements, where $0 \leq u \leq 100$, $0 \leq v \leq 100$ and $0 \leq w \leq 80$. In accordance with the invention $50 \leq a \leq 99$, $1 \leq b \leq 50$, $0 \leq c \leq 50$ and $0 \leq d \leq 20$.

In a preferred embodiment of a layer system in accordance with the invention, in particular $45 \leq \alpha \leq 55$, applies to the index $\alpha$ of the atoms $Va, Me_b, M_c, X_d$ $40 \leq \alpha \leq 80$ present in the layer.

If one looks at further specific embodiments of the invention, $80 \leq a$ can apply and/or $c=0$ and $d=0$ and $v=0$ and $w=0$, with $Me_b$ preferably, but not necessarily, being the element Zr.

In another embodiment, the portion of vanadium can be given by $a=80$, or $a=84$, or $a=88$, or for example $a=97$.

The surface layer can in particular have the composition $(V_{95}Me_5)_\alpha(N_u C_v O_w)_\beta$, where $u=30$, $v=65$, $w=5$, and where Me is preferably Ni and where preferably $\alpha=55$ at %.

In a further embodiment, the surface layer can have the composition $(V_{96}Me_4)_\alpha(N_u C_v O_w)_\beta$, where $u=65$, $v=25$, $w=10$, and where Me is preferably Ce and where preferably $\alpha=50$ at %.

In a third embodiment, the surface layer has, for example, the composition $(V_{75}Me_{15}X_{10})_\alpha N_\beta$, where Me is preferably Mo and/or X is preferably S and preferably $\alpha=52$ at %.

In a fourth embodiment, the surface layer can have the composition $(V_{75}Me_{15}X_{10})_\alpha(N_u C_v O_w)_\beta$, where $u=25$, $v=70$, $w=5$, where M is preferably Mo, and/or X is preferably Si and B in equal parts.

Another embodiment of the invention relates to a layer system in which the surface layer has the composition $(V_{75}Me_{15}M_{10})_\alpha(N_u C_v O_w)_\beta$, where $u=25$, $v=70$, $w=5$, and Me is preferably Mo, and/or M is preferably Cr, and $\alpha$ is preferably 52 at %.

In accordance with the invention, the surface layer can also have the composition $(V_{96}Zr_4)_\alpha(N_u C_v O_w)_\beta$, where $u=0$, $v=100$, $w=0$, where $\alpha$ is preferably 40 at %.

In accordance with the invention, the surface layer can also have the composition $(V_{98}Zr_2)_\alpha(N_u C_v O_w)_\beta$, where $u=100$, $v=0$, $w=0$, where $\alpha$ is preferably 50 at %.

The relation $40 \leq \alpha \leq 60$, specifically $45 \leq \alpha \leq 55$, and preferably $\alpha \approx 50$, particularly advantageously applies to the parameter $\alpha$.

In this respect, the invention also relates to layer systems in which a further part layer is provided between the surface layer and the substrate which is in particular an adhesive layer applied directly to the surface of the substrate.

The part layer in a specific embodiment is an adhesive layer of the composition $V_{97}Zr_3$, and/or an adhesive layer of the composition $V_{80}Zr_{20}$.

In another embodiment of the present invention, the part layer has the composition $(Al_{55}Ti_{45})_\gamma N_\delta$, where $\gamma+\delta=100$ at % and $40 \leq \gamma \leq 60$, where preferably $\gamma \approx 50$, and the part layer is in particular an adhesive layer, specifically an adhesive layer applied directly to the substrate.

A further embodiment relates to a part layer of the composition $(Al_{69}Cr_{29}Mg_1Si_1)_\gamma N_\delta$, where $\gamma+\delta=100$ at % and $40 \leq \gamma \leq 60$, and preferably $\gamma \approx 50$, where the part layer is in particular an adhesive layer, specifically an adhesive layer applied directly to the substrate.

The part layer can advantageously also have the composition $Al_{60}Cr_{30}Mg_5Si_5)_\gamma N_\delta$, where $\gamma+\delta=100$ at % and $40 \leq \gamma \leq 60$, and preferably $\gamma \approx 50$, where the part layer is in particular an adhesive layer, specifically an adhesive layer applied directly to the substrate.

In another case, the part layer has the composition $Al_{91}Cr_3Mg_3Si_3)_\gamma N_\delta$, where $\gamma+\delta=100$ at % and $40 \leq \gamma \leq 60$, and preferably $\gamma \approx 50$, where the part layer is in particular an adhesive layer, specifically an adhesive layer applied directly to the substrate.

In this respect, the invention also covers further part layers with other chemical compositions. The part layer can thus also be a TiN and/or a Cr part layer, in particular an adhesive layer, specifically an adhesive layer applied directly to the substrate.

To optimize the properties of the total layer, the part layers can be made of gradient layers known to the skilled person, e.g. TiCrN with an increasing Cr content, starting from the substrate surface, or multilayer coatings, e.g. Cr/CrN as a layer sequence in the part layer.

A layer system and/or a part layer and/or a surface layer of the present invention can have a hardness of, for example, HK 0.025 between 1500 and 3500, specifically a hardness HK 0.025 between 1900 and 3100, in particular a hardness HK between 2100 and 2900.

A thickness of the layer system and/or of the part layer and/or of the surface layer can advantageously be between 0.01 μm and 100 μm, specifically between 0.1 μm and 8 μm, and is preferably between 0.2 μm and 7.5 mm, where the layer system has a surface roughness $R_z$ between 0.2 μm and 10 μm, in particular between 0.5 μm and 5 μm preferably between 0.5 μm and 1.5 μm, and/or an adhesive strength of the layer system and/or of the part layer and/or of the surface layer in the range from HF 1 to HF 3, specifically HF 2 and preferably HF 1.

The invention furthermore relates to a coating process for the manufacture of a layer system of the present invention, wherein the coating process is a PVD process, preferably an arc coating process such as an arc process, a sputtering process or a combination process of arc coating process and sputtering process.

For the better understanding of the invention, Table 1 shows comparison examples VN (Example A), VNC (Example B) and the examples in accordance with the invention deposited by means of arc PVD. It was the aim of the invention to improve the hardness and thus the abrasion resistance of pure PVD layers on the basis of VN, VNC without reducing the adhesion to the parts to be coated. The partial substitution of V atoms by Zr or other metals increased the hardness by approximately 10%, looked at more closely here in the Zr substitution in the event of a nitridic layer Example 1 and Example 2 to comparison example A.

The following table shows some elected embodiments of surface layers in accordance with the invention.

TABLE 1

A selection of layer systems in accordance with the invention with important layer parameters, hardness measurement Knoop hardness, adhesion test HRC 150 kp (VDI 3824) on HSS of the hardness 66 HRC.

| Bottom layer | Functional layer | Hardness | Thickness Bottom layer/Function | Adhesion |
|---|---|---|---|---|
| Example 1 $V_{97}Zr_3$ | $(V_{97}Zr_3)_\alpha N_\beta$ $\alpha/\beta$ approx. 1 | 2129 | 0.2 μm/7.1 μm | HF 1 |
| Example 2 | $(V_{97}Zr_3)_\alpha N_\beta$ $\alpha/\beta$ approx. 1 | 2150 | 0/7 μm | HF 2 |
| Example 3 | $(V_{97}Zr_3)_\alpha(C_uN_v)_\beta$ u = 50, v = 50 $\alpha/\beta$ approx. 1 | 2879 | 5 μm | HF 3 |
| Example 4 $(Al_{55}Ti_{45})_\alpha N_\beta$ $\alpha/\beta$ approx. 1 | $(V_{95}Ni_5)_\alpha(C_uN_vO_w)_\beta$ u = 30, v = 65, w = 5 $\alpha/\beta$ approx. 1 | 2730 | 3 μm/4.5 μm | HF 2 |
| Example 5 $(Al_{69}Cr_{29}Mg_1Si_1)_\alpha N_\beta$ $\alpha/\beta$ approx. 1 | $(V_{96}Ce_4)_\alpha(C_uN_vO_w)_\beta$ u = 65, v = 25, w = 10 $\alpha/\beta$ approx. 1 | 3035 | 2.5 μm/4 μm | HF 3 |
| Example 6 | $(V_{97}Zr_1Si_1B_1)_\alpha N_\beta$ $\alpha/\beta$ approx. 1 | 2210 | 0/4 μm | HF 2 |

Application areas for layer system of the present invention are in particular shaping tools, in particular for half-shaping and hot shaping, molding tools, in particular for aluminum die casting, cutting tools, in particular with stainless steels, but also tools for plastic processing, and engine or motor elements, in particular piston rings, or turbine elements and pump elements, in particular moving parts.

A particularly preferred method for the manufacture of a layer system in accordance with the invention for a shaping tool will be set forth in the following:

EXAMPLE

Tool test and shaping tool Tool steel: DIN 1.2379

1. Tool was plasma nitride, nitriding hardness depth approx. 100 μm
2. Polishing the tool
3. Heating/Ion cleaning
   Heating to 400° C.
   10 min. AEGD ion cleaning with Ar, 200 V
   3 min. metal ion bombardment with VZr, 1000 V
4. Coating with 200 V
   200 nm VZr layer
   7.1 μm VZrN-layer, reactive gas nitrogen 5 Pa
5. Result HF Class 1
6. Polishing the layer to $R_z$ 0.9 μm Application Example
   Material to be shaped: HSS (JIS: SAPH400)
   Material thickness: 2-3 mm
   Press capacity: 3000 t
Result of the Durability Test:
PVD coating (CrN): 1000 strokes
CVD-coating (TiC): 4000 strokes
VZrN coating in accordance with Example 1: 7,200 strokes
   (test status—no endurance end)

Further preferred embodiments of the invention are set forth in the drawing. There are shown:

FIGS. 1a-1c a finish by means of a cap at a surface of a coating system in accordance with the invention;
FIGS. 2-4: embodiments of two-layer systems;
FIG. 5: embodiments with more than two layers.

In FIG. 1, which includes part FIGS. 1a-1c, an image of the surface of a coated substrate 100 can be seen which has been polished by means of a cap in a manner known per se. FIG. 1a shows the finish in 50 times magnification; FIGS. 1b and 1c a respective surface region in 500 times magnification.

The central circular region 2 in FIG. 1a is a freely polished surface region of the substrate 100 which no longer has any coating. The circular ring 3 is a polished region 1, 10 of the surface coating in accordance with the invention. The outer region 1, 11 is an unpolished surface region. Essential physical parameters of the surface regions are set forth in the drawing. The adhesive strength of the layer is HF 1.

Figure 4:
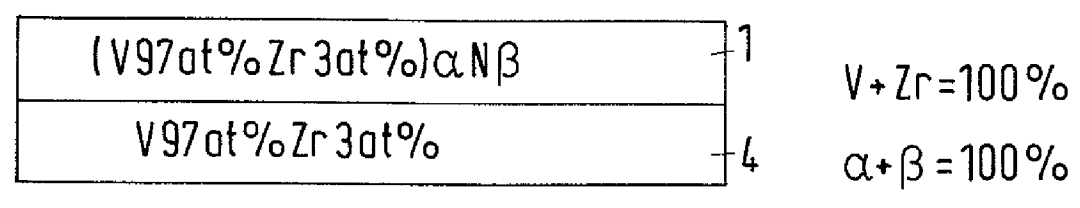

FIGS. 2 to 5 show embodiments with two and more part layers 4 which can be stoichiometric and non-stoichiometric. The respective chemical composition of the layer systems or part layers are set forth.

FIG. 4 shows a test example in accordance with the invention with the given cathode composition V97at % Zr3at %.

Figure 1:
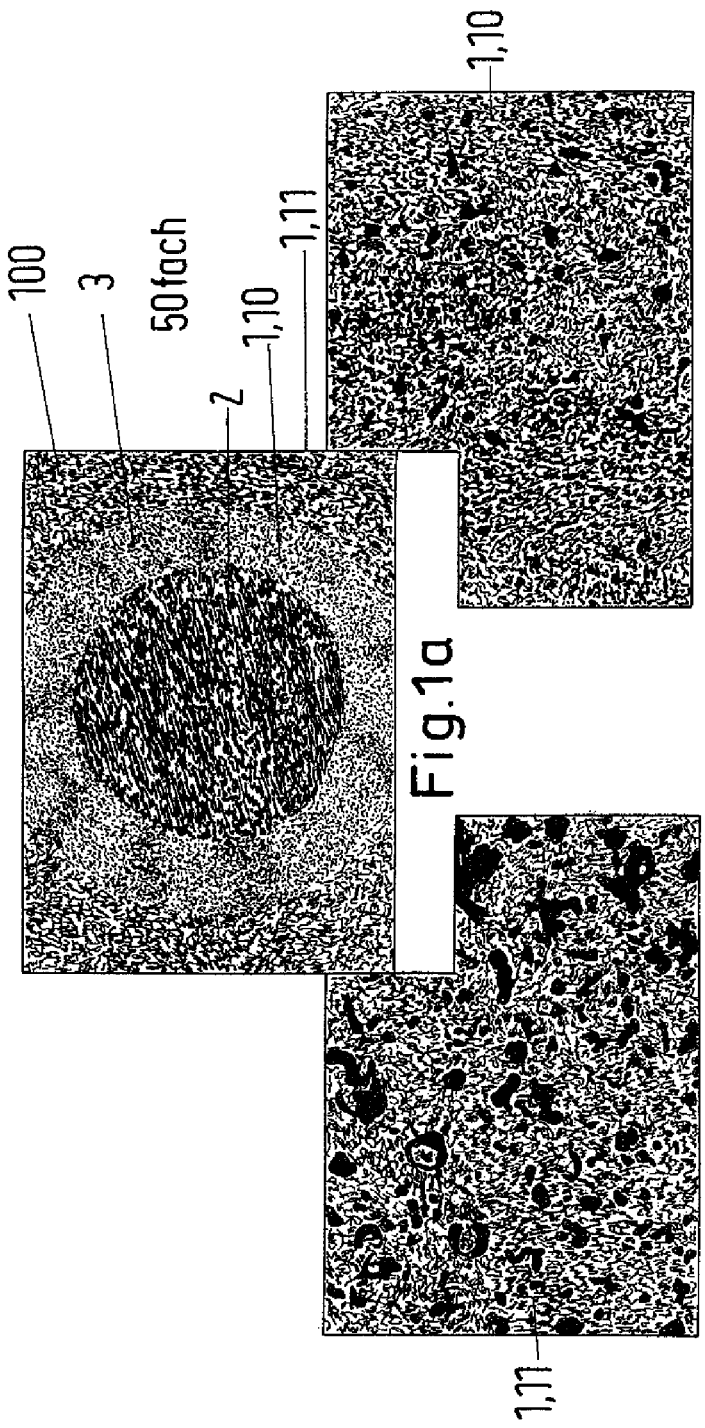
Figure 2:
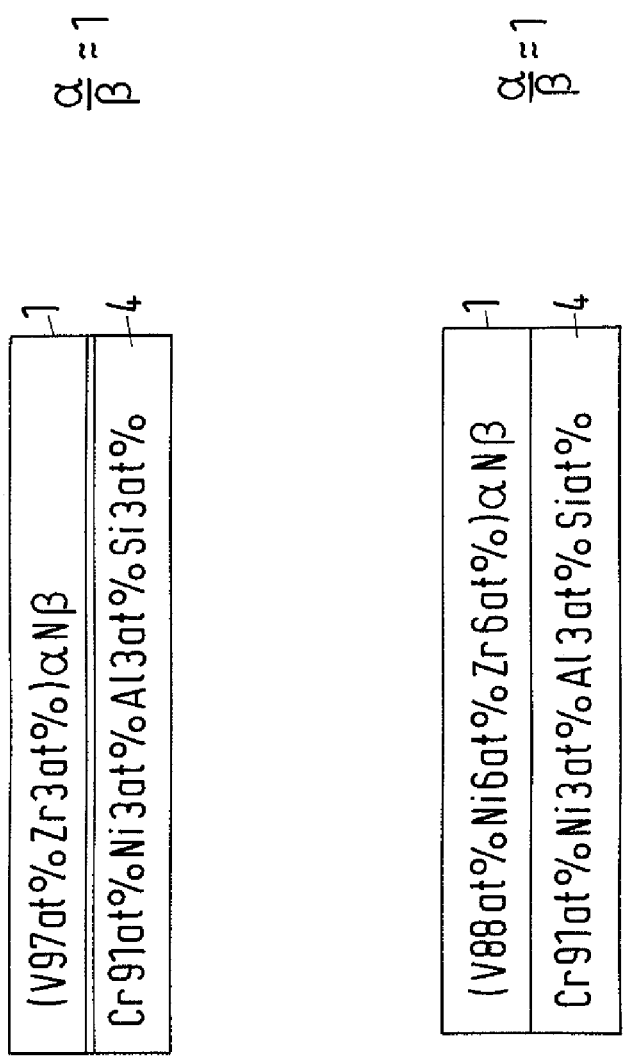
Figure 3:
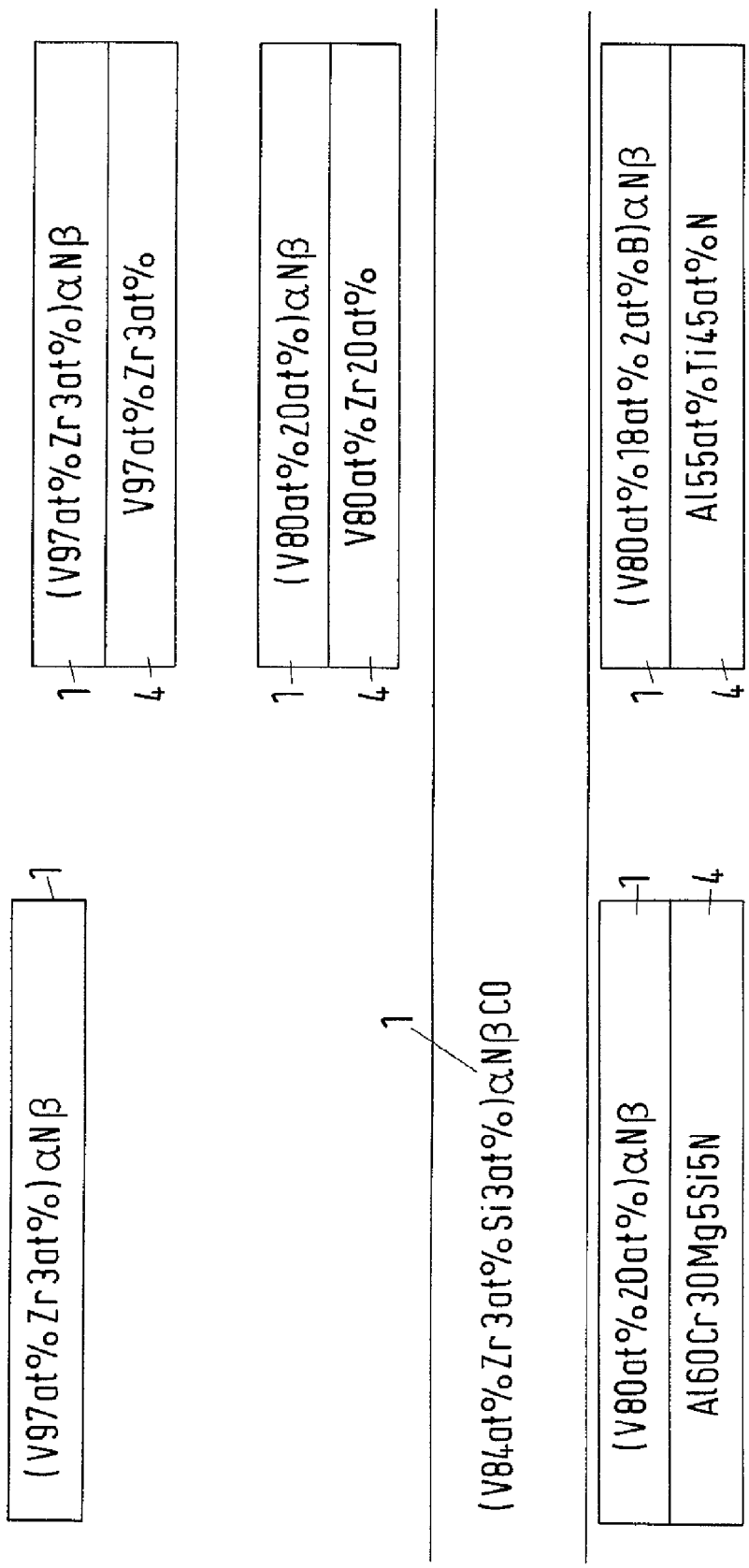
Figure 5:
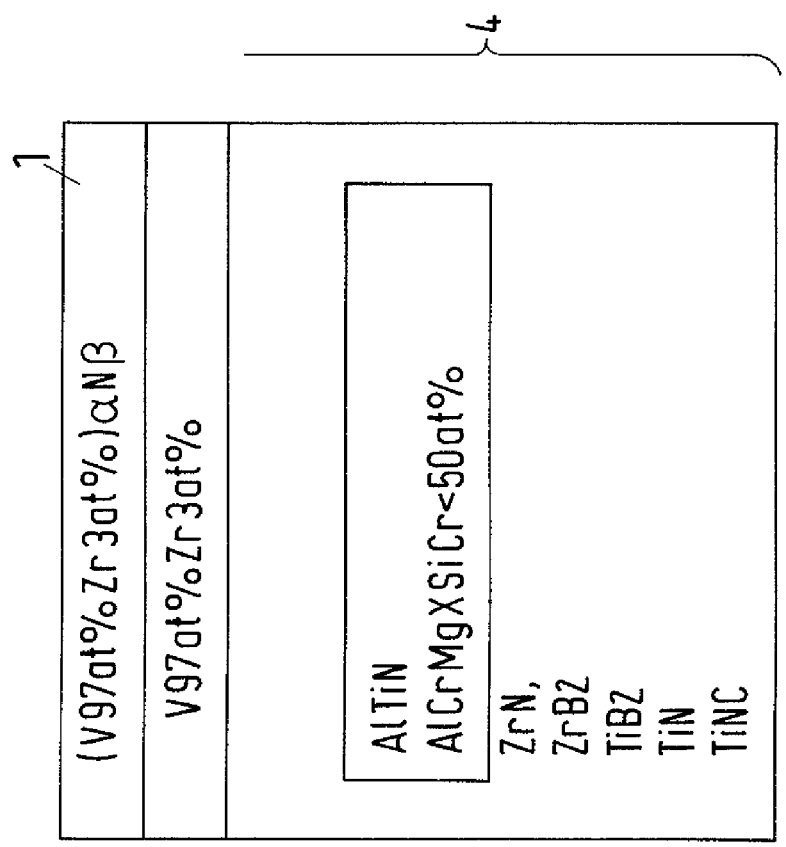

FIG. 5 shows a layer system which can typically be used for shaping tools with different possible bottom layers whose possible compositions are set forth in FIG. 5. In this connection, the compositions of different possible bottom layers 4 are drawn schematically. The Al layers marked by borders in this respect in particular show good thermal insulation properties on the basis of poor thermal conductivity.

The invention claimed is:

1. A layer system for the formation of a surface layer on a surface of a substrate, in particular on the surface of a shaping tool, wherein the layer system includes at least one first surface layer of the composition $(V_aMe_bM_cX_d)_\alpha(N_uC_vO_w)_\beta$, where $(a+b+c+d) = \alpha$, $\alpha=100\%$, with respect to the atoms $V_a, Me_b, M_c, X_d$ present in the layer, $(u+v+w)=\beta$, $\beta=100\%$ with respect to the atoms N, C, O present in the layer, with the sum of all atoms in the layer $(\alpha+\beta)=100$ at %, where $40 \leq \alpha \leq 80$ at % applies, and where
   $Me_b$ is at least one element from the group of chemical elements including:
   Zr, Hf, Nb, Ta, Mo, W, Ni, Cu, Sc, Y, La, Ce, Pr, Nd, Pm, Sm of the periodic system of chemical elements;
   $M_c$ is at least one element from the group of chemical elements including:
   Ti, Cr; and
   $X_d$ is at least one element from the group of chemical elements including:
   S, Se, Si, B of the periodic system of chemical elements, where $0 \leq u \leq 100$, $0 \leq v \leq 100$ and $0 < w \leq 80$, wherein
50≤a≤99, 1≤b≤50, 0≤c≤50 and 0≤d≤20,
wherein an adhesive strength of the layer system or of the surface layer is from HF 1 to HF 3.

2. A layer system in accordance with claim 1, wherein 80≤a.

3. The layer system in accordance with claim 1, wherein $Me_b$ is the element Zr.

4. A layer system in accordance with claim 3, wherein one of a=80, a=84, a=88 and a=97.

5. A layer system in accordance with claim 1, wherein one of a=80, a=84, a=88 and a=97.

6. A layer system in accordance with claim 1, wherein the surface layer has the composition $(V_{95}Me_5)_\alpha(N_uC_vO_w)_\beta$, where u=30, v=65, w=5, and where Me is Ni.

7. A layer system in accordance with claim 1, wherein the surface layer has the composition $(V_{96}Me_4)_\alpha(N_uC_vO_w)_\beta$, where u=65, v=25, w=10, and where Me is Ce.

8. A layer system in accordance with claim 1, wherein the surface layer has the composition $(V_{75}Me_{15}X_{10})_\alpha(N_uC_vO_w)_\beta$, where u=25, v=70, w=5, and Me is Mo, and/or X is Si and B in equal parts.

9. A layer system in accordance with claim 1, wherein the surface layer has the composition $(V_{75}Me_{15}M_{10})_\alpha(N_uC_vO_w)_\beta$, where u=25, v=70, w=5, and Me is Mo and/or M is Cr and α is 52 at %.

10. A layer system in accordance with claim 1, wherein 40≤α≤60.

11. A layer system in accordance with claim 1, wherein a further part layer which is an adhesive layer applied directly to the surface of the substrate is provided between the surface layer and the substrate.

12. A layer system in accordance with claim 11, wherein the part layer is the composition $V_{97}Zr_3$.

13. A layer system in accordance with claim 11, wherein the part layer is the composition $V_{80}Zr_{20}$.

14. A layer system in accordance with claim 11, wherein the part layer is the composition $(Al_{55}Ti_{45})_\gamma N_\delta$, where γ+δ=100 at % and 40≤γ≤60.

15. A layer system in accordance with claim 1, wherein the part layer is the composition $(Al_{69}Cr_{29}Mg_1Si_1)_\gamma N_\delta$, where γ+δ=100 at % and 40≤γ≤60.

16. A layer system in accordance with claim 11, wherein the part layer is the composition $(Al_{60}Cr_{30}Mg_5Si_5)_\gamma N_\delta$, where γ+δ=100 at % and 40≤γ≤60.

17. A layer system in accordance with claim 11, wherein the part layer is the composition $(Cr_{91}Ni_3Al_3Si_3)_\gamma N_\delta$, where γ+δ=100 at % and 40≤γ≤60.

18. A layer system in accordance with claim 11, wherein the part layer is a TiN part layer.

19. A layer system in accordance with claim 11, wherein the part layer is a Cr part layer.

20. A layer system in accordance with claim 1, wherein the hardness of the layer system or of the surface layer has a hardness HK 0.025 between 1500 and 3500.

21. A layer system in accordance with claim 1, wherein a thickness of the layer system or of the surface layer is between 0.01 μm and 100 μm.

22. A layer system in accordance with claim 1, wherein the surface layer has a surface roughness $R_z$ between 0.2 μm and 10 μm.

23. A layer system in accordance with claim 1, wherein 45≤α≤55.

24. A layer system for the formation of a surface layer on a surface of a substrate, in particular on the surface of a shaping tool, wherein the layer system includes at least one first surface layer of the composition $(V_aMe_bM_cX_d)_\alpha(N_uC_vO_w)_\beta$, where (a+b+c+d)=α, α=100%, with respect to the atoms $V_a, Me_b, M_c, X_d$ present in the layer, (u+v+w) =β, β=100% with respect to the atoms N, C, O present in the layer, with the sum of all atoms in the layer (α+β)=100 at %, where 40≤α≤80 at % applies, and where $Me_b$ is at least one element from the group of chemical elements including:
Zr, Hf, Nb, Ta, Mo, W, Ni, Cu, Sc, Y, La, Ce, Pr, Nd, Pm, Sm of the periodic system of chemical elements;

$M_c$ is at least one element from the group of chemical elements including:
Ti, Cr;

and $X_d$ is at least one element from the group of chemical elements including:
S, Se, Si, B of the periodic system of chemical elements, where 0≤u≤100, 0≤v≤100 and 0≤w≤80, wherein
50≤a≤99, 1≤b≤50, 0≤c≤50 and 0≤d≤20,
wherein an adhesive strength of the layer system or of the surface layer is from HF 1 to HF 3; and
wherein a further part layer which is an adhesive layer applied directly to the surface of the substrate is provided between the surface layer and the substrate, the part layer being chosen from the following compositions:
the composition $V_{97}Zr_3$;
the composition $V_{80}Zr_{20}$;
the composition $(Al_{55}Ti_{45})_\gamma N_\delta$, where γ+δ=100 at % and 40≤γ≤60;
the composition $(Al_{69}Cr_{29}Mg_1Si_1)_{\gamma N\delta}$, where γ+δ=100 at % and 40≤γ≤60;
the composition $(Al_{60}Cr_{30}Mg_5Si_5)_\gamma N_\delta$, where γ+δ=100 at % and 40≤γ≤60; and
the composition $(Cr_{91}Ni_3Al_3Si_3)_\gamma N_\delta$, where γ+δ=100 at % and 40≤γ≤60.

25. A layer system for the formation of a surface layer on a surface of a substrate, in particular on the surface of a shaping tool, wherein the layer system includes at least one first surface layer of the composition $(V_aMe_bM_cX_d)_\alpha(N_uC_vO_w)_\beta$, where (a+b+c+d)=α, α=100%, with respect to the atoms $V_a, Me_b, M_c, X_d$ present in the layer, (u+v+w) =β, β=100% with respect to the atoms N, C, O present in the layer, with the sum of all atoms in the layer (α+β) =100 at %, where 40≤α≤80 at % applies, and where $Me_b$ is at least one element from the group of chemical elements including:
Zr, Hf, Nb, Ta, Mo, W, Ni, Cu, Sc, Y, La, Ce, Pr, Nd, Pm, Sm of the periodic system of chemical elements;

$M_c$ is at least one element from the group of chemical elements including:
Ti, Cr; and $X_d$ is at least one element from the group of chemical elements including:
S, Se, Si, B of the periodic system of chemical elements, where 0≤u≤100, 0≤v≤100 and 0≤w≤80, wherein
50≤a≤99, 1≤b≤50, 0≤c≤50 and 0≤d≤20;
wherein a further part layer which is an adhesive layer applied directly to the surface of the substrate is provided between the surface layer and the substrate,
wherein the part layer is chosen from A) the composition of $V_aZr_b$, where 80≤a≤97 and 3≤b≤20; B) the composition of $(Al_{55}Ti_{45})_\gamma N_\delta$, where γ+δ=100 at % and 40≤γ≤60; C) the composition of $(Al_cCr_dMg_eSi_f)_\gamma N_\delta$, where γ+=100 at %, 40≤γ≤, 60,6 0≤c≤69, 29≤d≤30, 1≤e≤5, and 1≤f≤5;

and D) the composition is $(Cr_{91}Ni_3Al_3Si_3)_\gamma N_\delta$, where $\gamma+\delta=100$ at % und $40\leq\gamma\leq60$; and wherein an adhesive strength of the layer system or of the surface layer is from HF 1 to HF 3.

* * * * *